(12) United States Patent
Goyal et al.

(10) Patent No.: US 11,360,143 B2
(45) Date of Patent: Jun. 14, 2022

(54) HIGH SPEED DEBUG-DELAY COMPENSATION IN EXTERNAL TOOL

(71) Applicants: STMicroelectronics International N.V., Geneva (CH); STMicroelectronics Application GmbH, Aschheim-Dornach (DE); STMicroelectronics S.r.l., Agrate Brianza (IT)

(72) Inventors: Avneep Kumar Goyal, Greater Noida (IN); Deepak Baranwal, Greater Noida (IN); Thomas Szurmant, Munich (DE); Nicolas Bernard Grossier, Oreno di Vimercate (IT)

(73) Assignees: STMicroelectronics International N.V., Geneva (CH); STMicroelectronics Application GmbH, Aschheim-Dornach (DE); STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/083,876

(22) Filed: Oct. 29, 2020

(65) Prior Publication Data
US 2022/0137128 A1  May 5, 2022

(51) Int. Cl.
*G01R 31/317* (2006.01)
*G01R 31/3185* (2006.01)
(Continued)

(52) U.S. Cl.
CPC . *G01R 31/31727* (2013.01); *G01R 31/31713* (2013.01); *G01R 31/31723* (2013.01);
(Continued)

(58) Field of Classification Search
CPC ........ G01R 31/31727; G01R 31/31713; G01R 31/31723; G01R 31/31725;
(Continued)

(56) References Cited

U.S. PATENT DOCUMENTS 6,105,157 A    8/2000  Miller
6,298,465 B1  10/2001  Klotchkov
(Continued)

OTHER PUBLICATIONS

S. Sunter, S. A. Shaikh and Q. Lin, "Fast BIST of I/O Pin AC specifications and inter-chip delays," 2014 International Test Conference, Seattle, Wa, USA, 2014, pp. 1-8. (Year: 2014).*
(Continued)

*Primary Examiner* — Cynthia Britt
(74) *Attorney, Agent, or Firm* — Crowe & Dunlevy

(57) ABSTRACT

A testing tool includes a clock generation circuit generating a test clock and outputting the test clock via a test clock output pad, data processing circuitry clocked by the test clock, and data output circuitry receiving data output from the data processing circuitry and outputting the data via an input/output (IO) pad, the data output circuitry being clocked by the test clock. The testing tool also includes a programmable delay circuit generating a delayed version of the test clock, and data input circuitry receiving data input via the IO pad, the data input circuitry clocked by the delayed version of the test clock. The delayed version of the test clock is delayed to compensate for delay between transmission of a pulse of the test clock via the test clock output pad to an external computer and receipt of the data input from the external computer via the IO pad.

21 Claims, 3 Drawing Sheets

(51) Int. Cl.
*G01R 31/3193* (2006.01)
*G06F 11/34* (2006.01)
*G01R 31/319* (2006.01)
*G06F 11/36* (2006.01)

(52) U.S. Cl.
CPC . *G01R 31/31725* (2013.01); *G01R 31/31922* (2013.01); *G01R 31/31937* (2013.01); *G01R 31/318525* (2013.01); *G06F 11/34* (2013.01); *G06F 11/348* (2013.01); *G06F 11/36* (2013.01)

(58) Field of Classification Search
CPC ...... G01R 31/318525; G01R 31/31922; G01R 31/31937; G06F 11/34; G06F 11/348; G06F 11/36
See application file for complete search history.

(56) References Cited

U.S. PATENT DOCUMENTS

| | | | | |
|---|---|---|---|---|
| 6,798,241 | B1* | 9/2004 | Bauer | H03K 5/135 326/37 |
| 8,384,410 | B1 | 2/2013 | De La Puente et al. | |
| 9,660,656 | B2* | 5/2017 | Subramanian | G06F 1/08 |
| 2002/0069374 | A1* | 6/2002 | Kopser | H04L 7/0045 713/400 |
| 2008/0034265 | A1 | 2/2008 | Kang | |
| 2012/0124423 | A1* | 5/2012 | Chakravadhanula | G01R 31/31727 714/27 |
| 2014/0189457 | A1* | 7/2014 | Mak | G01R 31/31716 714/745 |
| 2015/0185285 | A1* | 7/2015 | Kovalev | G01R 31/3172 714/727 |

OTHER PUBLICATIONS

S. Sunter and M. Tilmann, "BIST of I/O circuit parameters via standard boundary scan," 2010 IEEE International Test Conference, Austin, TX, USA, 2010, pp. 1-10. (Year: 2010).*
B. I. Dervisoglu and G. E. Stong, "Design for Testability Using Scan Path Techniques for Path-Delay Test and Measurement," 1991, Proceedings. International Test Conference, Nashville, TN, USA, 1991, pp. 365-. (Year: 1991).*
P. Gillis, F. Woytowich, K. McCauley and U. Baur, "Delay test of chip I/Os using LSSD boundary scan," Proceedings International Test Conference 1998 (IEEE Cat. No.98CH36270), Washington, DC, USA, 1998, pp. 83-90. (Year: 1998).*
"XDS Target Connection Guide," Oct. 2009, Texas Instruments, http://processors.wiki.ti.com/index.php/XDS_Target_Connection_Guide, 1 page.
"ARM Debugger," Feb. 21, 2020, Lauterbach GmbH, https://www2.lauterbach.com/pdf/debugger_arm.pdf, 280 pages.
EP Search Report and Written Opinion for co-pending EP Application No. 21202658.7, report dated Mar. 16, 2022, 10 pgs.

* cited by examiner

HIGH SPEED DEBUG-DELAY COMPENSATION IN EXTERNAL TOOL

TECHNICAL FIELD

This disclosure is related to the field of automotive test interfaces and, in particular, is directed to an external tool, configured for interfacing with an automotive controller, which has an increased throughput in excess of what a standard debugging interface provides.

BACKGROUND

For performing debugging of automotive software (for example, powertrain and/or chassis management software executed by a powertrain and/or chassis computer), an external test tool interfaces with the relevant vehicle computer system in order to access runtime data. Such runtime data is typically updated at a high speed. It is desired for the external test tool to be able to communicate with the relevant computer on the vehicle to read this runtime data from the SRAM of the relevant computer, on the fly and in real time.

In some situations, for example when reading runtime engine calibration data, the amount of data is large, so the runtime data is to be read at high speed by the external test tool. The issue with this is that both the external test tool and the debug interface within the vehicle computer operate based upon a test clock generated by the external test tool. In a typical arrangement, in each cycle of the test clock, one bit of data is sent from the external test tool to the vehicle computer and one bit of data is sent from the vehicle computer back to the external test tool. Since both the data input and data output circuitry within the external test tool and the data input and data output circuitry within the vehicle computer operate based upon the test clock, this means a timing constraint is created in that data is to be sent from the external test tool to the vehicle computer, and back from the vehicle computer to the external test tool, within one period of the test clock. Therefore, if the leading edge of a bit of data from the vehicle computer is received by the data input circuitry within the external test tool after the end of the clock period of the test clock during which that data was supposed to be received, a malfunction has occurred and the intended communication rate has not been achieved.

The challenge in ensuring that this timing constraint is met and malfunction avoided is that delay which is present throughout the path. This delay path results from the addition of the delay present starting from the clock source in the external test tool to a data capture flip-flop, and back into the external test tool. For illustration purposes, delays can be divided into small segments. The segments are, from starting, from the clock source of the external test tool to the external test tool clock output pin, from the external test tool clock output pin to a connector for the external test tool, wire delays within the connector for the external test tool, wire delays within a connector for the vehicle computer, from the connector of the vehicle computer to the input clock pad of the vehicle computer, from the clock pad of the vehicle computer to the clock pulse input of a launch flip-flop, from the clock pulse input of the launch flip-flop to the output of the launch flip-flop, from the output of the launch flip-flop to the output data pad of the vehicle computer, from the output data pad of the vehicle computer to the connector of the vehicle computer, wire delays within the connector of the vehicle computer, wire delays within the connector of the external test tool, from the connector of the external test tool to the data input pin of the external test tool, and from the data input pin of the external test tool to a capture flip-flop.

In an attempt to increase data throughput for situations where high data throughput between the external test tool and vehicle computer is desired, the frequency of the test clock may be increased. However, the above mentioned timing constraint is still present, and the above described delays are still present and largely unchanging regardless of the frequency of the test clock. Therefore, the clock speed can only be increased so far, as if it is increased too much, the above mentioned timing constraint will be violated.

As such, further development into data communications systems between the external test tool and vehicle computer is needed so as to provide increased throughput over what is available today, since the amount of runtime data collected by vehicle computers, and therefore the data that is to be read by the external test tools, is ever increasing and current systems cannot keep pace.

SUMMARY

Described herein is a testing tool, including a clock generation circuit configured to generate a test clock and output the test clock via a test clock output pad, data processing circuitry clocked by the test clock, and data output circuitry configured to receive data output from the data processing circuitry and output the data via an input/output (IO) pad. The data output circuitry is clocked by the test clock. A programmable delay circuit is configured to generated a delayed version of the test clock, and data input circuitry is configured to receive data input via the IO pad. The data input circuitry is clocked by the delayed version of the test clock. The delayed version of the test clock is delayed to compensate for delay between transmission of a pulse of the test clock via the test clock output pad to an external computer and receipt of the data input from the external computer via the IO pad.

A test clock input pad may be coupled to the test clock output pad to receive the test clock, and the programmable delay circuit may receive the test clock from the test clock input pad.

A multiplexer may have inputs coupled to the clock generation circuit and the test clock input pad. The multiplexer may output the test clock received from the clock generation circuit or the test clock input pad responsive to a multiplexer select signal.

The programmable delay circuit may include a chain of delay buffers, with a first delay buffer of the chain receiving the test clock from the multiplexer as input, and a second multiplexer having inputs coupled to outputs of each delay buffer of the chain and passing output of one of the delay buffers of the chain responsive to a programmable delay selection signal.

The programmable delay circuit may include a chain of delay buffers, with a first delay buffer of the chain receiving the test clock as input, and a multiplexer having inputs coupled to outputs of each delay buffer of the chain and passing output of one of the delay buffers of the chain responsive to a programmable delay selection signal.

The programmable delay circuit may include a delay locked loop or a multi-phase phase locked loop which outputs the delayed version of the test clock according to its programming by a processor in the testing tool.

The programmable delay circuit may include a circuit customized to produce the delayed version of the test clock.

The data processing circuitry may include a field programmable gate array.

The data output circuitry may include at least one flip flop clocked by the test clock.

The data input circuitry may include at least one flip flop clocked by the delayed version of the test clock.

Additional data output circuitry may be configured to receive additional data output from the data processing circuitry and output the additional data via an additional input/output (IO) pad, with the additional data output circuitry being clocked by the test clock. Additional data input circuitry may be configured to receive additional data input via the additional IO pad, with the additional data input circuitry being clocked by the delayed version of the test clock.

The additional data output circuitry may include at least one flip flop clocked by the test clock.

The additional data input circuitry may include at least one flip flop clocked by the delayed version of the test clock.

Also disclosed herein is a system including a computer. The computer includes computer data processing circuitry clocked by a test clock received via a test clock input pad, and computer data output circuitry configured to receive data output from the computer data processing circuitry and output the data via a computer input/output (IO) pad, with the computer data output circuitry being clocked by the test clock. Computer data input circuitry is configured to receive data input via the computer IO pad, the computer data input circuitry being clocked by the test clock. The system also includes a testing tool, which includes a clock generation circuit configured to generate the test clock and output the test clock via a test clock output pad connected to the test clock input pad of the computer by a connector, data processing circuitry clocked by the test clock, and data output circuitry configured to receive data output from the data processing circuitry and output the data via an input/output (IO) pad to the computer IO pad of the computer via the connector, the data output circuitry being clocked by the test clock. A programmable delay circuit is configured to generate a delayed version of the test clock. Data input circuitry is configured to receive data input via the IO pad, the data input circuitry being clocked by the delayed version of the test clock, with the delayed version of the test clock being delayed to compensate for delay between transmission of a pulse of the test clock via the test clock output pad to the test clock input pad and receipt of the data input from the computer via the IO pad.

A test clock input pad may be coupled to the test clock output pad to receive the test clock, with the programmable delay circuit receiving the test clock from the test clock input pad.

A multiplexer may have inputs coupled to the clock generation circuit and the test clock input pad, with the multiplexer outputting the test clock received from the clock generation circuit or the test clock input pad responsive to a multiplexer select signal.

The programmable delay circuit may include a chain of delay buffers, with a first delay buffer of the chain receiving the test clock from the multiplexer as input, and a second multiplexer having inputs coupled to outputs of each delay buffer of the chain and passing output of one of the delay buffers of the chain responsive to a programmable delay selection signal.

The data processing circuitry may include a field programmable gate array. The data output circuitry may include at least one flip flop clocked by the test clock. The data input circuitry may include at least one flip flop clocked by the delayed version of the test clock.

The computer data output circuitry may include at least one flip flop clocked by the test clock, and the computer data input circuitry may include at least one flip flop clocked by test clock.

The testing tool may also include additional data output circuitry configured to receive additional data output from the data processing circuitry and output the additional data via an additional input/output (IO) pad, the additional data output circuitry being clocked by the test clock, and additional data input circuitry configured to receive additional data input via the additional IO pad, the additional data input circuitry being clocked by the delayed version of the test clock.

The computer may also include additional computer data output circuitry configured to receive additional data output from the computer data processing circuitry and output the additional data via an additional computer input/output (IO) pad, the additional computer data output circuitry being clocked by the test clock, and additional computer data input circuitry configured to receive additional data input via the additional computer IO pad, the additional computer data input circuitry being clocked by the test clock.

The additional computer data output circuitry may include at least one flip flop clocked by the test clock, and wherein the additional computer data input circuitry may include at least one flip flop clocked by the test clock.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
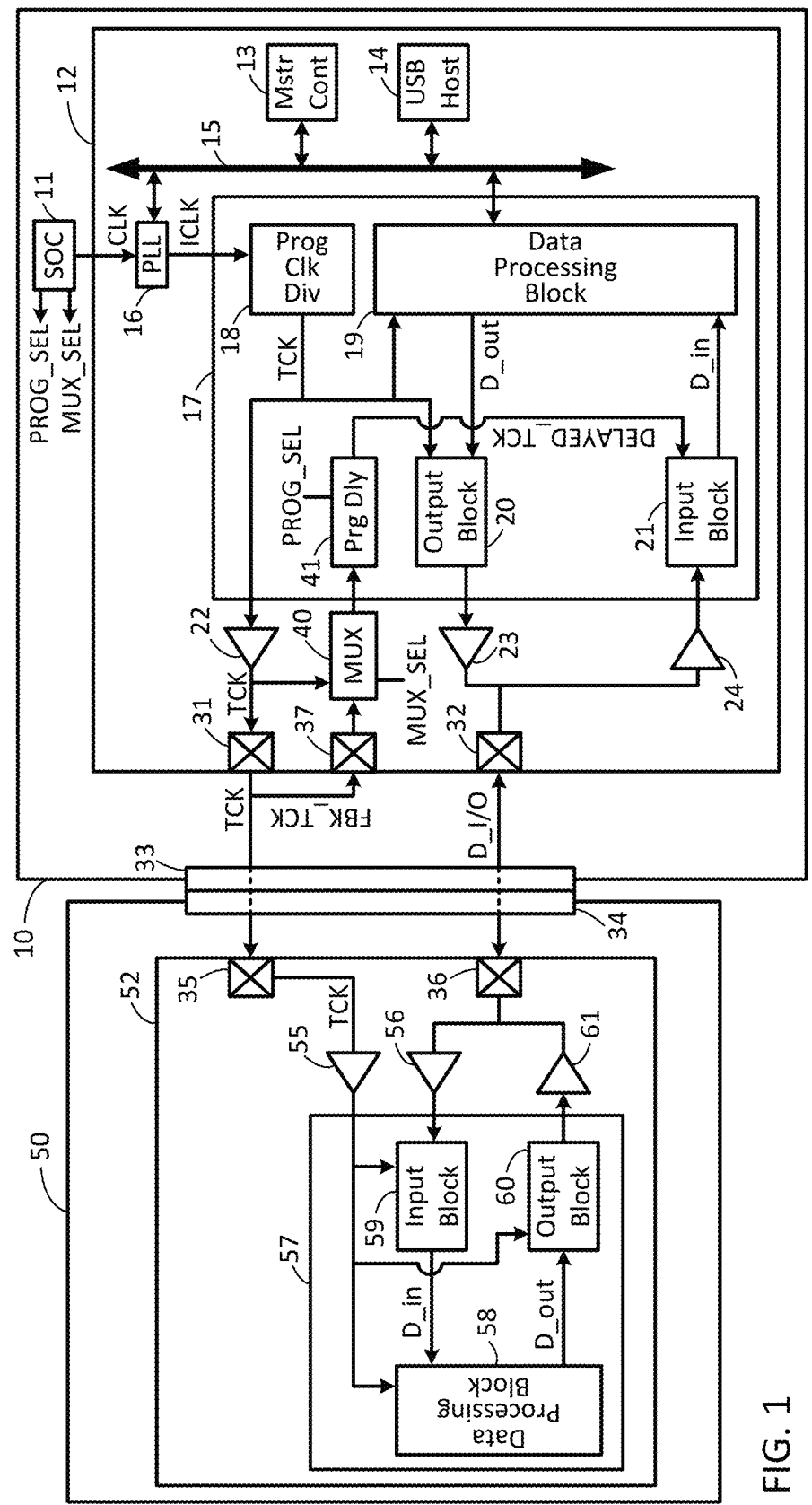
FIG. 1 is a block diagram of an external tool connected to a vehicle computer, the external tool being capable of high data rate communications, as described herein.

An embodiment is shown in FIG. 1, where an external tool 10 communicates with a vehicle computer 50 over an interface established by connecting their external connectors 33 and 34 together. The external tool 10 may be a debug tool, for example, and may be comprised of a debugger board carrying a device 12 (for example, including a field programmable gate array or FPGA). A system on a chip (SOC) 11 on the debugger board outputs a clock signal CLK to a phase locked loop (PLL) 16 within the device 12. The PLL 16 processes this clock to produce an internal clock ICLK which is transmitted both to a bus interface 15 as well as a programmable clock divider 18 within a debug protocol controller 17 that is within the device 12. The programmable clock divider 18 divides the internal clock ICLK to produce a test clock TCK, which is transmitted both to other components inside the debug protocol controller 17 as well as externally to the vehicle computer 50 through connectors 33, 34. A master controller 13 as well as a USB host 14 are connected to the bus interface 15, for example to facilitate communication with a data processing circuit 19 within the debug protocol controller 17. The data processing circuit 19 may be, for example, a field programmable gate array.

Internally, the test clock TCK is transmitted to the data processing circuit 19 and an output circuit 20 (e.g., a flip flop) within the debug protocol controller 17. In addition, the test clock TCK is received by a driver 22, which drives a TCK_OUT pad 31 and a multiplexer 40 with the test clock TCK. Note that the TCK_OUT pad 31 is connected to a TCK_IN pad 37 to receive a feedback version of the test clock, labeled as FBK_TCK. The multiplexer 40 also receives the feedback version of the test clock FBK_TCK. The multiplexer 40 selects one of FBK_TCK and TCK to pass to a programmable delay circuit 41, responsive to a multiplexer select signal MUX_SEL. The programmable delay circuit 41 generates a delayed version of the test clock DELAYED_TCK therefrom based upon a programmable delay select signal PROG_SEL. The delayed version of the test clock DELAYED_TCK is in turn passed to the input circuit 21 (e.g., a flip flop).

The multiplexer select signal MUX_SEL and programmable delay select signal PROG_SEL may be generated by the SOC 11, for example.

Figure 2:
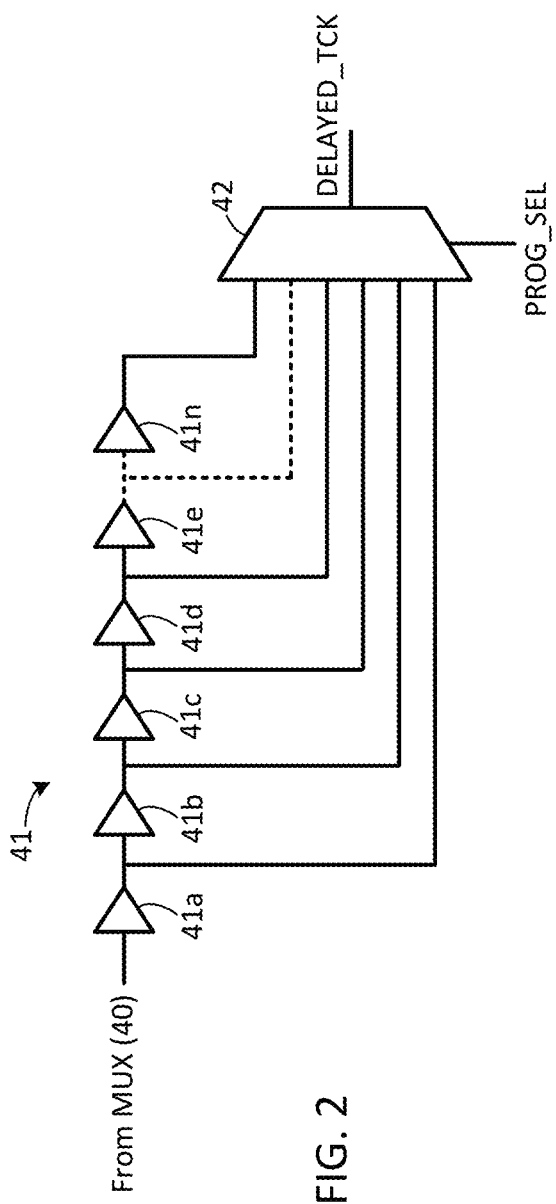
FIG. 2 is a schematic block diagram of the programmable delay circuit of FIG. 1.

One potential implementation of the programmable delay circuit 41 may be found in FIG. 2, where it may be observed that the programmable delay circuit 41 is formed by a chain of n delay buffers 41a, . . . , 41n, with the input to the chain being received as output from the multiplexer 40, and with the outputs of each of the n delay buffers 41a, . . . , 41n being fed to a multiplexer 42 as input. The multiplexer 42, responsive to the programmable delay select signal PROG_SEL, selects the output of one of the chain of n delay buffers 41a, . . . , 41n to pass as the delayed test clock DELAYED_TCK.

Note that there can be more such implementation methods to produce a programmable delay, such as a multi-phase phase locked loop, a delay locked loop, or any circuit customized to produce the delayed test clock DELAYED_TCK. If utilized, the multi-phase phase locked loop or delay locked loop may output the delayed test clock DELAYED_TCK responsive to its programming by the SOC 11.

The output circuit 20 (which is clocked by the test clock TCK) receives a data output D_out from the data processing circuit 19. The output circuit 20 processes and passes the data output D_out to a driver 23, which drives the data output D_out onto the data IO pad 32.

The input circuit 21 receives data D_I/O from the vehicle computer 50 via the data IO pad 32, which is then driven by the driver 24 to the input circuit 21 (which is clocked by the delayed test clock DELAYED_TCK), which in turn processes and passes the input data to the data processing circuit 19 as data input D_in.

The TCK_OUTPUT pad 31 and data 10 pad 32 are connected to the connector 33 of the external tool 10, which connects to the connector 34 of the vehicle computer 50, in turn connecting the TCK_OUTPUT pad 31 of the external tool 10 to the TCK_INPUT pad 35 of the vehicle computer 50 and connecting the data 10 pad 32 of the external tool 10 to the data IO pad 36 of the vehicle computer 50.

The vehicle computer 50 may include a device 52, such as a system on a chip (SOC). The device 52 includes a high speed debug protocol target module 57. When the test clock TCK is received at the TCK_IN pad 35, it is then driven by the driver 55 to be used to clock the data processing circuit 58, input circuit 59 (e.g., a flip flop), and output circuit 60 (e.g., a flip flop) of the high speed debug protocol target module 57. Data output by the external tool 10, via the data IO pad 32, to the data IO pad 36 of the high speed debug protocol target module 57, is driven by the driver 56 to the input circuit 59, which processes the received data and passes it to the data processing circuit 58 as D_in. Similarly, data is output by the data processing circuit 58 as D_out to the output circuit 60, where it is driven by the driver 61 onto the data IO pad 36 as D_I/O for transmission to the data IO pad 32 of the external tool 10.

Note that there is a delay in the transmission of the test clock TCK from driver 22 to the TCK_OUTPUT pad 31, from the TCK_OUTPUT pad 31 through the connectors 33 and 34 to the TCK_IN pad 35, from the TCK_IN pad 35 to the high speed debug protocol target module 57. This is just the delay in the transmission of the test clock TCK.

Now note that there is a delay between clocking of the data processing circuit 58 by the test clock TCK to the production of the data output D_out, the processing of the data output D_out by the output circuit 60, and the driving and passing of the data output by the driver 61 to the IO pad 36, through the connectors 34 and 33, to the input IO pad 32, through the driver 24, and finally to the input circuit 21.

If the data output by the driver 24 were received by the input circuit 21 after the end of a period of the test clock TCK, then communication during a single clock period has not been achieved, and an error has occurred. However, by having the input circuit 21 of the external test tool 10 be clocked by the delayed version of the test clock DELAYED_TCK, extra time is created for the data output by the driver 24 to be received by the input circuit 21. Indeed, the delay applied to the test clock TCK (or the feedback test clock FBK_TCK) by the programmable delay circuit 41 may almost (but not equal) to a single period of the test clock TCK.

Figure 3:
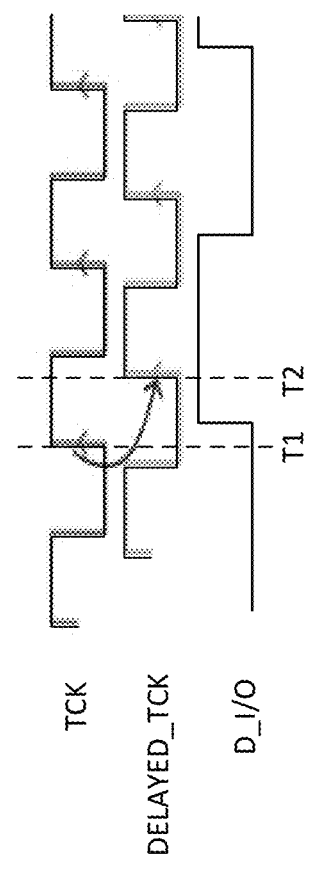
FIG. 3 is a timing diagram of the external tool of FIG. 1 in operation.

This can be observed in FIG. 3. Notice that at time T1, when the test clock TCK rises, the edge of the data input D_I/O has not yet arrived. Therefore, if input circuit 21 were to be clocked by the test clock TCK, it would have missed the rising edge of the data input D_I/O. However, by generating the delayed version of the test clock DELAYED_TCK and using it to clock the input circuit 21, at the rising edge of DELAYED_TCK at time T2, the rising edge of the data input D_I/O has arrived, so the input circuit 21 correctly reads the rising edge of D_I/O.

While these results are achievable regardless of whether the multiplexer 40 selects the test clock TCK itself or the feedback test clock FBK_TCK, in some situations, it may be preferable to select the feedback test clock FBK_TCK because the path taken by the test clock TCK in creating the feedback test clock FBK_TCK replicates the delay in transmission of the test clock TCK from the TCK_OUTPUT pad 31 and receipt of the test clock TCK at the TCK_IN pad 35—stated another way, the feedback test clock FBK_TCK is a version of the test clock TCK delayed by the input/output delay inherent in transmission of the test clock TCK. Therefore, since this delay is replicated, less delay is to be added by the programmable delay circuit 41.

In addition, in some instanced, the multiplexer 40 may not be present, and the test clock TCK or the feedback test clock FBK_TCK may instead be directly passed from the pad 37 to the programmable delay circuit 41.

The advantages provided by the external tool 10 are readily apparent. Through the use of the delayed test clock DELAYED_TCK, the frequency of the test clock TCK can be increased above the level at which, in the absence of the use of the delayed test clock DELAYED_TCK, errors would occur. This helps increase throughput, for example, to 10 megabytes per second, with test clock TCK having a frequency of 125 MHz.

To further increase throughput, the data input and output structures described above with reference to FIG. 1 may be replicated, for example, to provide for two serial data connections that operate simultaneously, thereby doubling effective data throughput to, for example, 20 megabytes per second.

Figure 4:
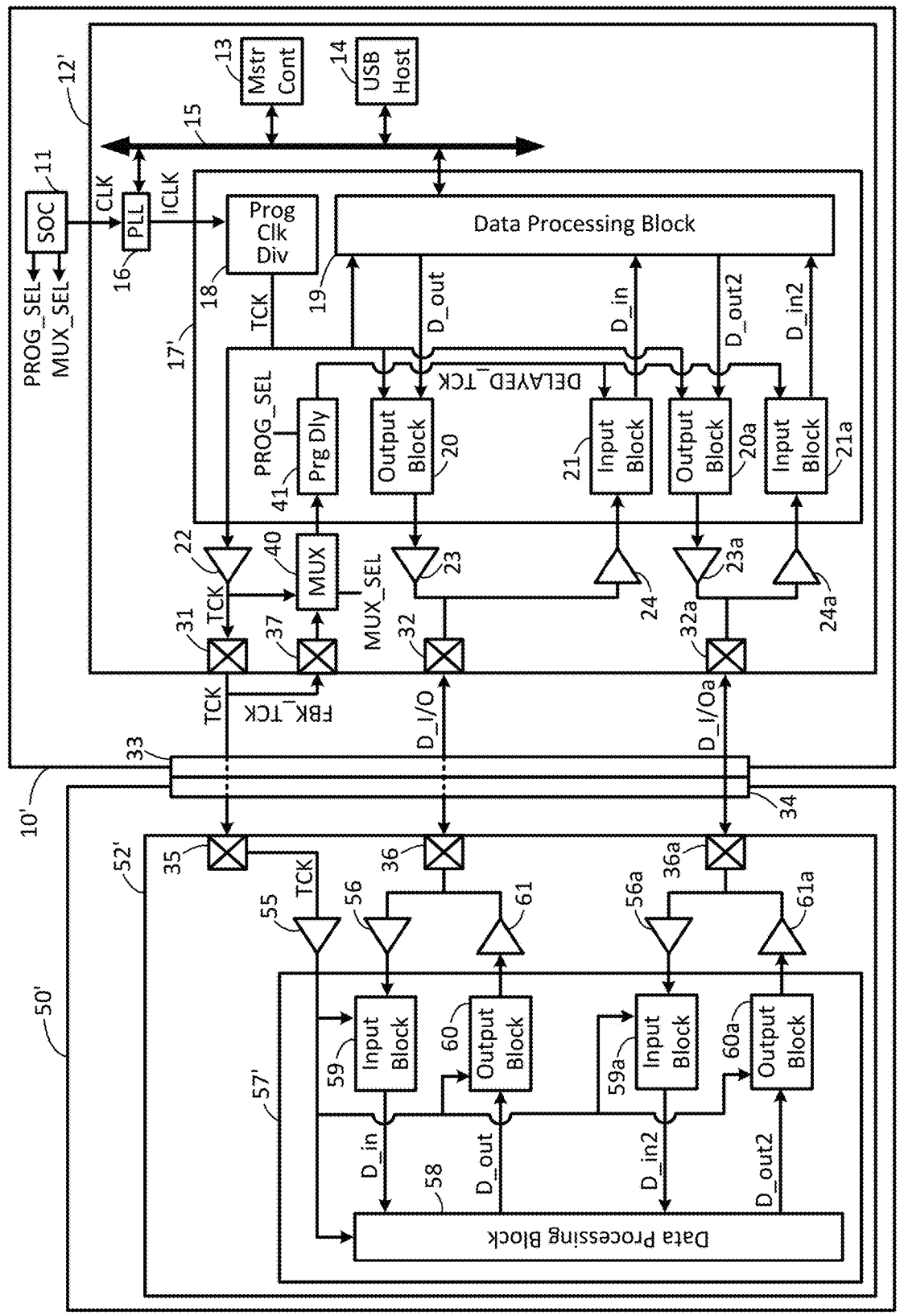
FIG. 4 is a block diagram of an external tool connected to a vehicle computer utilizing two serial connections, the external tool being capable of high data rate communications, as described herein.

Thus, as shown in the embodiment of FIG. 4, the external tool 10' may include an additional input circuit 21*a* and output circuit 20*a*. The output circuit 20*a* is clocked by the test clock TCK and receives a data output D_out2 from the data processing circuit 19. The output circuit 20*a* processes and passes the data output D_out2 to a driver 23*a*, which drives the data output D_out2 onto the data 10 pad 32*a*.

The input circuit 21*a* receives data D_I/Oa from the vehicle computer 50' via the data 10 pad 32*a*, which is then driven by the driver 24*a* to the input circuit 21*a* (which is clocked by the delayed test clock DELAYED_TCK), which in turn processes and passes the input data to the data processing circuit 19 as data input D_in2.

Similarly, the vehicle computer 50' may include an additional input circuit 59*a* and output circuit 60*a*, both of which are clocked by the test clock TCK as received by the vehicle computer 50'. Data output by the external tool 10', via the data IO pad 32*a*, to the data IO pad 36*a* of the high speed debug protocol target module 57', is driven by the driver 56*a* to the input circuit 59*a*, which processes the received data and passes it to the data processing circuit 58 as D_in2. Likewise, data is output by the data processing circuit 58 as D_out2 to the output circuit 60*a*, where it is driven by the driver 61*a* onto the data IO pad 36*a* as D_I/Oa for transmission to the data IO pad 32*a* of the external tool 10'.

The vehicle computer 50 or 50' described herein may utilize an ARM based architecture. The ARM based architecture incorporates a framework known as the Coresight architecture, which is broken into multiple subsystems. Relevant to this disclosure, the subsystem used for debug is known as the data access port (DAP) system. The DAP is an implementation of the ARM Debug Interface Architecture Specification (all versions of which that exist at the time of this filing being hereby incorporated by reference in their entirety). The ARM Debug Interface Architecture Specification provides three different protocols which can be used for communication between the DAP system and the outside world, namely the JTAG Debug Port (based upon IEEE standard 1149.1, also incorporated by reference in its entirety), the Serial Wire Debug (SWD) Port, and the Serial Wire/JTAG Debug Port, which is a combination of the first two. As a non-limiting example, the external tool 10 or 10' described hereinabove may communicate with the vehicle computer 50 or 50' using one or more of the serial wire debug port interfaces of the vehicle computer 50 or 50'. However, it should be understood that the techniques herein are equally applicable to the other ARM Debug Interface Architecture Specification protocols, as well as to non-ARM related debug protocols.

Although the above has been described in the context of the external test tool 10 and 10' being for communication with a vehicular computer 50 or 50', the external test tool 10 and 10' described herein may communicate with any computer 50' or 50' similarly arranged.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A testing tool, comprising:
   a clock generation circuit configured to generate a test clock and output the test clock via a test clock output pad;
   data processing circuitry clocked by the test clock;
   data output circuitry configured to receive data output from the data processing circuitry and output the data via an input/output (IO) pad, the data output circuitry being clocked by the test clock;
   a programmable delay circuit configured to generate a delayed version of the test clock; and
   data input circuitry configured to receive data input via the IO pad, the data input circuitry being clocked by the delayed version of the test clock, wherein the delayed version of the test clock is delayed to compensate for delay between transmission of a pulse of the test clock via the test clock output pad to an external computer and receipt of the data input from the external computer via the IO pad.

2. The testing tool of claim 1, further comprising a test clock input pad coupled to the test clock output pad to receive the test clock, wherein the programmable delay circuit receives the test clock from the test clock input pad.

3. The testing tool of claim 2, further comprising a first multiplexer having inputs coupled to the clock generation circuit and the test clock input pad, wherein the first multiplexer outputs the test clock received from the clock generation circuit or the test clock input pad responsive to a multiplexer select signal.

4. The testing tool of claim 3, wherein the programmable delay circuit comprises:
   a chain of delay buffers, wherein a first delay buffer of the chain receives the test clock from the first multiplexer as input; and
   a second multiplexer having inputs coupled to outputs of each delay buffer of the chain and passing output of one of the delay buffers of the chain responsive to a programmable delay selection signal.

5. The testing tool of claim 1, wherein the programmable delay circuit comprises:
   a chain of delay buffers, wherein a first delay buffer of the chain receives the test clock as input; and
   a multiplexer having inputs coupled to outputs of each delay buffer of the chain and passing output of one of the delay buffers of the chain responsive to a programmable delay selection signal.

6. The testing tool of claim 1, wherein the programmable delay circuit comprises a delay locked loop or a multi-phase phase locked loop that, which outputs the delayed version of the test clock according to its programming by a processor in the testing tool.

7. The testing tool of claim 1, wherein the programmable delay circuit comprises a circuit customized to produce the delayed version of the test clock.

8. The testing tool of claim 1, wherein the data processing circuitry comprises a field programmable gate array.

9. The testing tool of claim 1, wherein the data output circuitry comprises at least one flip flop clocked by the test clock.

10. The testing tool of claim 1, wherein the data input circuitry comprises at least one flip flop clocked by the delayed version of the test clock.

11. The testing tool of claim 1, further comprising:
additional data output circuitry configured to receive additional data output from the data processing circuitry and output the additional data via an additional input/output (IO) pad, the additional data output circuitry being clocked by the test clock; and
additional data input circuitry configured to receive additional data input via the additional IO pad, the additional data input circuitry being clocked by the delayed version of the test clock.

12. The testing tool of claim 11, wherein the additional data output circuitry comprises at least one flip flop clocked by the test clock.

13. The testing tool of claim 11, wherein the additional data input circuitry comprises at least one flip flop clocked by the delayed version of the test clock.

14. A system, comprising:
a computer, comprising:
computer data processing circuitry clocked by a test clock received via a test clock input pad;
computer data output circuitry configured to receive data output from the computer data processing circuitry and output the data via a computer input/output (IO) pad, the computer data output circuitry being clocked by the test clock; and
computer data input circuitry configured to receive data input via the computer IO pad, the computer data input circuitry being clocked by the test clock; and
a testing tool, comprising:
a clock generation circuit configured to generate the test clock and output the test clock via a test clock output pad connected to the test clock input pad of the computer by a connector;
data processing circuitry clocked by the test clock;
data output circuitry configured to receive data output from the data processing circuitry and output the data via an input/output (IO) pad to the computer IO pad of the computer via the connector, the data output circuitry being clocked by the test clock;
a programmable delay circuit configured to generate a delayed version of the test clock; and
data input circuitry configured to receive data input via the IO pad, the data input circuitry being clocked by the delayed version of the test clock, wherein the delayed version of the test clock is delayed to compensate for delay between transmission of a pulse of the test clock via the test clock output pad to the test clock input pad and receipt of the data input from the computer via the IO pad.

15. The system of claim 14, further comprising a test clock input pad coupled to the test clock output pad to receive the test clock, wherein the programmable delay circuit receives the test clock from the test clock input pad.

16. The system of claim 15, further comprising a first multiplexer having inputs coupled to the clock generation circuit and the test clock input pad, wherein the first multiplexer outputs the test clock received from the clock generation circuit or the test clock input pad responsive to a multiplexer select signal.

17. The system of claim 16, wherein the programmable delay circuit comprises:
a chain of delay buffers, wherein a first delay buffer of the chain receives the test clock from the first multiplexer as input; and
a second multiplexer having inputs coupled to outputs of each delay buffer of the chain and passing output of one of the delay buffers of the chain responsive to a programmable delay selection signal.

18. The system of claim 14, wherein the data processing circuitry comprises a field programmable gate array; wherein the data output circuitry comprises at least one flip flop clocked by the test clock; and wherein the data input circuitry comprises at least one flip flop clocked by the delayed version of the test clock.

19. The system of claim 14, wherein the computer data output circuitry comprises at least one flip flop clocked by the test clock; wherein the computer data input circuitry comprises at least one flip flop clocked by test clock.

20. The system of claim 14,
wherein the testing tool further comprises:
additional data output circuitry configured to receive additional data output from the data processing circuitry and output the additional data via an additional input/output (IO) pad, the additional data output circuitry being clocked by the test clock; and
additional data input circuitry configured to receive additional data input via the additional IO pad, the additional data input circuitry being clocked by the delayed version of the test clock; and
wherein the computer further comprises:
additional computer data output circuitry configured to receive additional data output from the computer data processing circuitry and output the additional data via an additional computer input/output (IO) pad, the additional computer data output circuitry being clocked by the test clock; and
additional computer data input circuitry configured to receive additional data input via the additional computer IO pad, the additional computer data input circuitry being clocked by the test clock.

21. The system of claim 20, wherein the additional computer data output circuitry comprises at least one flip flop clocked by the test clock; and wherein the additional computer data input circuitry comprises at least one flip flop clocked by the test clock.

* * * * *